United States Patent
Auchter et al.

(10) Patent No.: US 12,287,633 B2
(45) Date of Patent: Apr. 29, 2025

(54) SYSTEM AND METHOD FOR COMPARING SIMULATED ENVIRONMENTS FOR UNMANNED GROUND VEHICLE DEVELOPMENT AND TESTING

(71) Applicant: Southwest Research Institute, San Antonio, TX (US)

(72) Inventors: Joseph A. Auchter, San Antonio, TX (US); Jerry A. Towler, San Antonio, TX (US); Robert J. Brothers, San Antonio, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 239 days.

(21) Appl. No.: 17/935,166

(22) Filed: Sep. 26, 2022

(65) Prior Publication Data

US 2024/0103516 A1    Mar. 28, 2024

(51) Int. Cl.
    *G05D 1/00* (2024.01)

(52) U.S. Cl.
    CPC ......... *G05D 1/0212* (2013.01); *G05D 1/0088* (2013.01)

(58) Field of Classification Search
    CPC .................. G05D 1/0212; G05D 1/0088
    See application file for complete search history.

*Primary Examiner* — Andrew J Cromer
(74) *Attorney, Agent, or Firm* — Grossman, Tucker, Perreault & Pfleger, PLLC

(57) ABSTRACT

In an approach to comparing simulated environments for unmanned ground vehicle development and testing, a system includes stored program instructions, the stored program instructions configured to: receive a first simulation scene and a second simulation scene; calculate a first costmap for the first simulation scene and a second costmap for the second simulation scene; calculate a traversability ratio metric comparing the first costmap and the second costmap; calculate a blob size metric comparing the first costmap and the second costmap; calculate an L2 distance between a first plurality of histograms from the first costmap and a second plurality of histograms from the second costmap; and determine whether a first environment of the first simulation scene and a second environment of the second simulation scene are similar based on the traversability ratio metric, the blob size metric, and the L2 distance.

20 Claims, 6 Drawing Sheets

SYSTEM AND METHOD FOR COMPARING SIMULATED ENVIRONMENTS FOR UNMANNED GROUND VEHICLE DEVELOPMENT AND TESTING

FIELD

The present application relates generally to simulated environments for unmanned ground vehicles (UGVs) and, more particularly, to a system and method for comparing simulated environments for unmanned ground vehicle development and testing.

BACKGROUND

A UGV is a vehicle that operates while in contact with the ground and without an onboard human presence. UGVs can be used for many applications where it may be inconvenient, dangerous, or impossible to have a human operator present. Generally, the vehicle will have a set of sensors to observe the environment and will either autonomously make decisions about its behavior or pass the information to a human operator at a different location who will control the vehicle through teleoperation.

Unmanned and autonomous ground vehicles have the potential to revolutionize military operations. Military vehicles, however, present unique challenges not encountered in civilian applications. These include a significant amount of off-road navigation, navigation in hostile or dangerous environments, navigation in environments lacking navigational aids such as the Global Positioning System (GPS), and navigation in foreign urban environments where little data regarding road networks is available. These unique challenges require tools for simulating and predicting the performance of unmanned and autonomous ground vehicles in realistic environmental conditions.

BRIEF DESCRIPTION OF THE DRAWINGS

Reference should be made to the following detailed description which should be read in conjunction with the following figures, wherein like numerals represent like parts.

DETAILED DESCRIPTION

Figure 1:
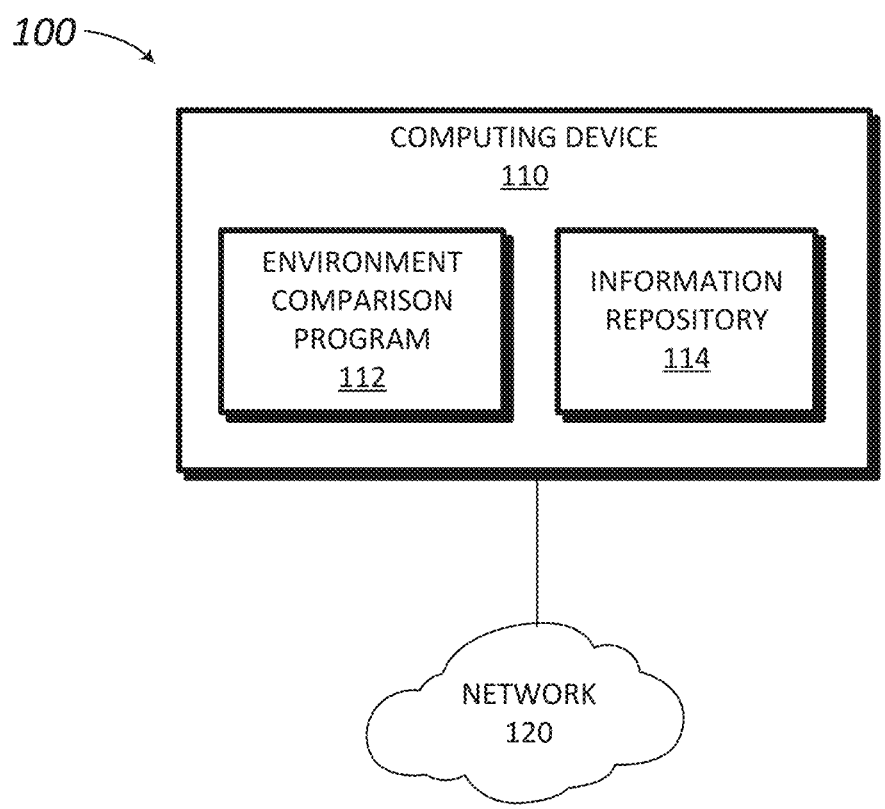
FIG. 1 is a functional block diagram illustrating a distributed data processing environment consistent with the present disclosure.

The present disclosure is not limited in its application to the details of construction and the arrangement of components set forth in the following description or illustrated in the drawings. The examples described herein may be capable of other embodiments and of being practiced or being carried out in various ways. Also, it may be appreciated that the phraseology and terminology used herein is for the purpose of description and should not be regarded as limiting as such may be understood by one of skill in the art. Throughout the present description, like reference characters may indicate like structure throughout the several views, and such structure need not be separately discussed. Furthermore, any particular feature(s) of a particular exemplary embodiment may be equally applied to any other exemplary embodiment(s) of this specification as suitable. In other words, features between the various exemplary embodiments described herein are interchangeable, and not exclusive.

Development and testing of unmanned ground vehicle (UGV) systems often rely on simulation. Part of the simulation system is typically a virtual environment in which the vehicle is operating. Often it is useful to test the system in many different virtual environments to exercise the UGV in different ways. There is a need to compare virtual environments to each other in quantitative ways that are distinctly important to UGV performance. Specifically, there exists a need to quantitatively compare two simulation environments to determine how similar they are, based on an analysis of certain quantitative characteristics of the costmap.

Disclosed herein is a system and computer-implemented method for comparing simulated environments for unmanned ground vehicle development and testing based on an analysis of certain quantitative characteristics of the costmap. The disclosed system and computer-implemented method quantitatively compare simulated environments from the perspective of the UGV. First, a costmap of the area of interest is generated in the simulated environment. A costmap is a top-down image representing a geographic area in the vicinity of the UGV. The area is divided into grid cells, and each cell is assigned a numerical value indicating the cost of the cell, determined by whether the UGV can expect to be able to traverse it. The costs can be generated from a variety of sources, including live sensor data or a priori information about the operating area. The costmap is of crucial importance to UGV behavior as the UGV makes many of its path planning decisions based on it. Therefore, the costmap is an appropriate place to make comparisons about how the UGV perceives its environment. Costmaps are often generated by software running on the UGV. However, the particular method of generating the costmap is not relevant to the present disclosure. As an example, a costmap constructed from information about terrain slope and roughness is illustrated and described in FIG. 2 below.

Next, the costs of individual costmap cells are divided into histogram bins (e.g., in cost categories such as: low, medium, high, and fatal). Example histograms of these bins for two different environments are illustrated and described in FIG. 3 below.

To assess how similar two environments are to each other as perceived by the UGV, the similarity of the UGV costmaps is examined between environments using three quantitative metrics, a traversability ratio metric, a blob size metric, and an L2 metric. The traversability ratio metric is further described in operation 606A of FIG. 6 below. The blob size metric is further described in FIG. 4 below. The L2 metric is further described in operation 606C of FIG. 6 below.

FIG. 1 is a functional block diagram illustrating a distributed data processing environment, generally designated 100, suitable for operation of the environment comparison program 112 consistent with the present disclosure. The term "distributed" as used herein describes a computer system that includes multiple, physically distinct devices that operate together as a single computer system. FIG. 1 provides only an illustration of one implementation and does not imply any limitations with regard to the environments in which different embodiments may be implemented. Many modifications to the depicted environment may be made by those skilled in the art without departing from the scope of the disclosure as recited by the claims.

Distributed data processing environment 100 includes computing device 110 optionally connected to network 120. Network 120 can be, for example, a telecommunications network, a local area network (LAN), a wide area network (WAN), such as the Internet, or a combination of the three, and can include wired, wireless, or fiber optic connections. Network 120 can include one or more wired and/or wireless networks that are capable of receiving and transmitting data, voice, and/or video signals, including multimedia signals that include voice, data, and video information. In general, network 120 can be any combination of connections and protocols that will support communications between computing device 110 and other computing devices (not shown) within distributed data processing environment 100.

Computing device 110 can be a standalone computing device, a management server, a web server, a mobile computing device, or any other electronic device or computing system capable of receiving, sending, and processing data. In an embodiment, computing device 110 can be a personal computer (PC), a desktop computer, a laptop computer, a tablet computer, a netbook computer, a smart phone, or any programmable electronic device capable of communicating with other computing devices (not shown) within distributed data processing environment 100 via network 120. In another embodiment, computing device 110 can represent a server computing system utilizing multiple computers as a server system, such as in a cloud computing environment. In yet another embodiment, computing device 110 represents a computing system utilizing clustered computers and components (e.g., database server computers, application server computers) that act as a single pool of seamless resources when accessed within distributed data processing environment 100.

In an embodiment, computing device 110 includes environment comparison program 112. In an embodiment, environment comparison program 112 is a program, application, or subprogram of a larger program for comparing simulated environments for unmanned ground vehicle development and testing. In an alternative embodiment, environment comparison program 112 may be located on any other device accessible by computing device 110 via network 120.

In an embodiment, computing device 110 includes information repository 114. In an embodiment, information repository 114 may be managed by environment comparison program 112. In an alternate embodiment, information repository 114 may be managed by the operating system of the computing device 110, alone, or together with, environment comparison program 112. Information repository 114 is a data repository that can store, gather, compare, and/or combine information. In some embodiments, information repository 114 is located externally to computing device 110 and accessed through a communication network, such as network 120. In some embodiments, information repository 114 is stored on computing device 110. In some embodiments, information repository 114 may reside on another computing device (not shown), provided that information repository 114 is accessible by computing device 110. Information repository 114 includes, but is not limited to, environment data, UGV data, scene data, sensor data, costmap data, histogram data, system data and other data that is received by environment comparison program 112 from one or more sources, and data that is created by environment comparison program 112.

Information repository 114 may be implemented using any volatile or non-volatile storage media for storing information, as known in the art. For example, information repository 114 may be implemented with random-access memory (RAM), solid-state drives (SSD), one or more independent hard disk drives, multiple hard disk drives in a redundant array of independent disks (RAID), optical library, or a tape library. Similarly, information repository 114 may be implemented with any suitable storage architecture known in the art, such as a relational database, an object-oriented database, or one or more tables.

Figure 2:
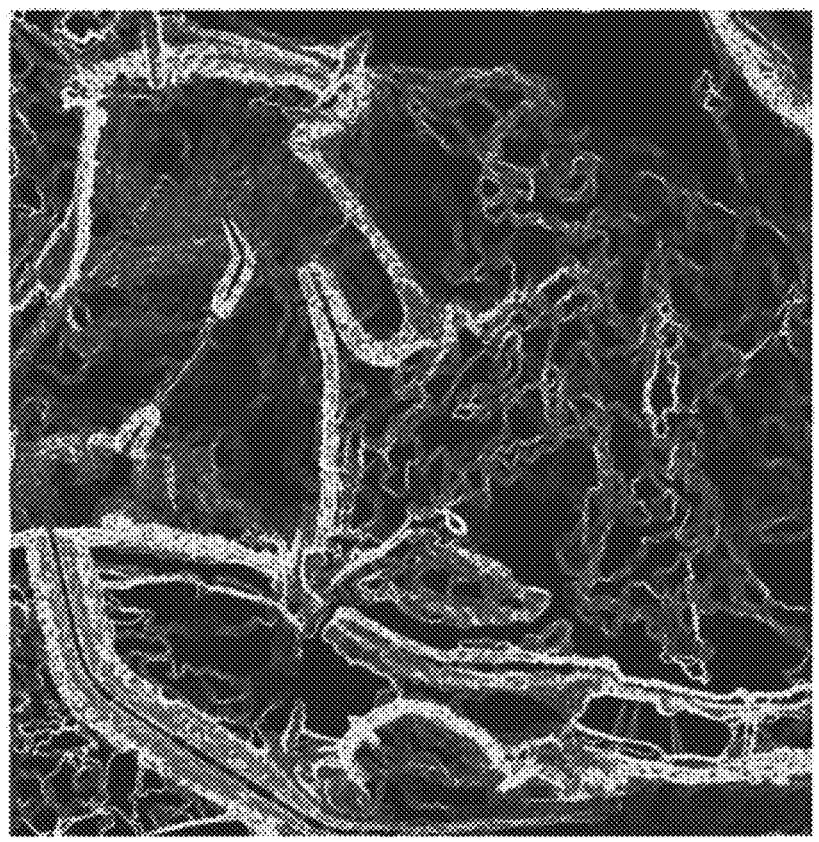
FIG. 2 is an example of a costmap corresponding to a geographic area, consistent with the present disclosure.

FIG. 2 is an example of a costmap 200 corresponding to a geographic area, consistent with the present disclosure. A costmap corresponds to a geographic area with various types of off-road rough terrain features. As used herein, a cost is a numerical value indicating the difficulty a UGV would have in traversing the terrain. In the example of FIG. 2, each pixel is assigned a numerical value corresponding to a cost, where dark areas are low cost and bright areas are high cost. In an embodiment, a costmap image may contain thousands or millions of pixels. For example, the costmap image of FIG. 2 is 2252 by 2320 pixels, for a total of 5,224,640 pixels.

Figure 3:
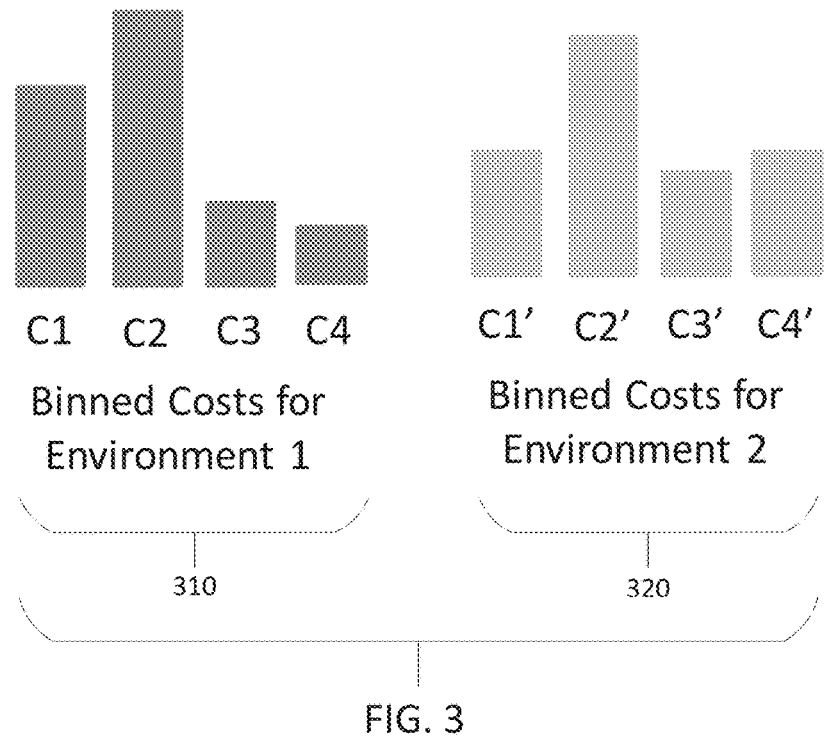
FIG. 3 is an example of costs that have been binned into four categories for two different environments.

FIG. 3 is an example illustrating two histograms, histogram 1-310 and histogram 2-320, where each histogram represents values from a costmap of a particular environment, i.e., environment 1 and environment 2. In this example, histogram 1-310 is divided into four bins of costs for environment 1 and histogram 2-320 is divided into four bins of costs for environment 2. In FIG. 3, the bins may represent, for example, four categories, low, medium, high, and fatal. While four bins are illustrated in FIG. 3, any number of bins representing any number of categories may be used.

Figure 4:
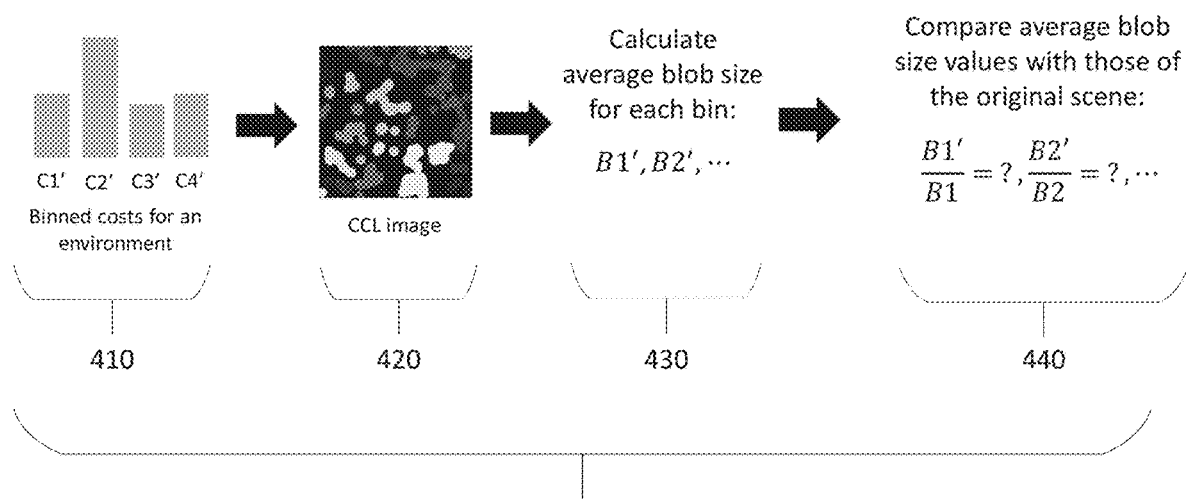
FIG. 4 is an example flow diagram of the process for calculating the blob size metric.
Figure 5:
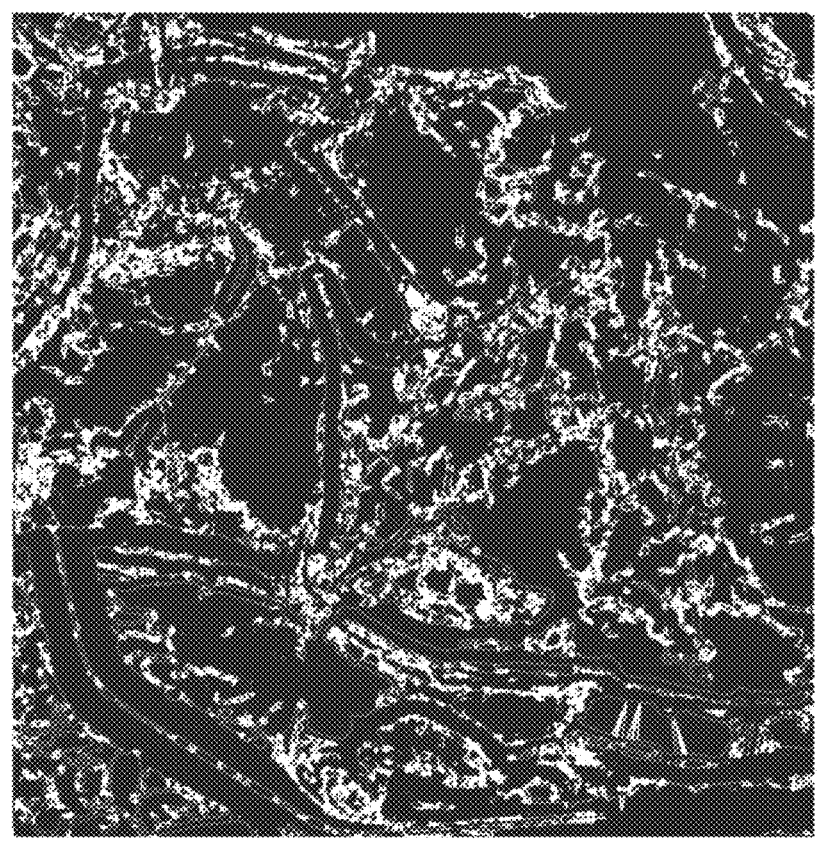
FIG. 5 is an example of a binary image for one bin of a costmap such as the costmap from FIG. 2.

FIG. 4 is an example flow diagram of the process for calculating the blob size metric. First, the pixel values (i.e., the costs) in each costmap, e.g., costmap 200 from FIG. 2, are binned into a desired number of bins. For each cost bins 410 in a costmap image, i.e., bin C1', bin C2', bin C3', and bin C4', a thresholding operation (e.g., the Open-Source Computer Vision Library (OpenCV) cv.threshold function) is used to generate a new costmap image containing only the values in that bin. Another threshold operation is then performed on the resulting image to set all non-zero values to the same value (e.g., "255"), thus creating a binary image 420 of pixel values that are either 0 or 255. FIG. 5 is an example image of the binary image for one bin 500 of a costmap such as the costmap 200 from FIG. 2.

In operation 430, connected component labeling (CCL) (using, for example, OpenCV's connectedComponentsWithStats function using a Spaghetti algorithm with 8-way connectivity) is performed on each of these thresholded images to identify each of the connected components (i.e., the "blobs") and the connected component size (i.e., the area represented by the number of pixels). CCL, also called blob extraction, is an algorithmic application of graph theory, where subsets of connected components are uniquely labeled based on a given heuristic. Connected-component labeling is used to detect connected regions in digital images. This results in blob size B1' for bin C1', blob size B2' for bin C2', blob size B3' for bin C3', and blob size B4' for bin C4'.

In operation 440, the average size of all of the connected components (blobs) is calculated for each of these thresholded binary bin costmap images. These average blob sizes are what are compared with each other across different environments for the metric. For example, the blob sizes B1', B2', B3', and B4' for the current environment are compared to the corresponding blob sizes B1, B2, B3, and B4 from the bins of another environment. The blob size metric is the value of this comparison. Closer averages indicate that the UGV perceives the environments to be similar. If the average blob size difference is 25% or less between the environments under comparison, the two environments can be considered to be similar from the perspective of the UGV.

Figure 6:
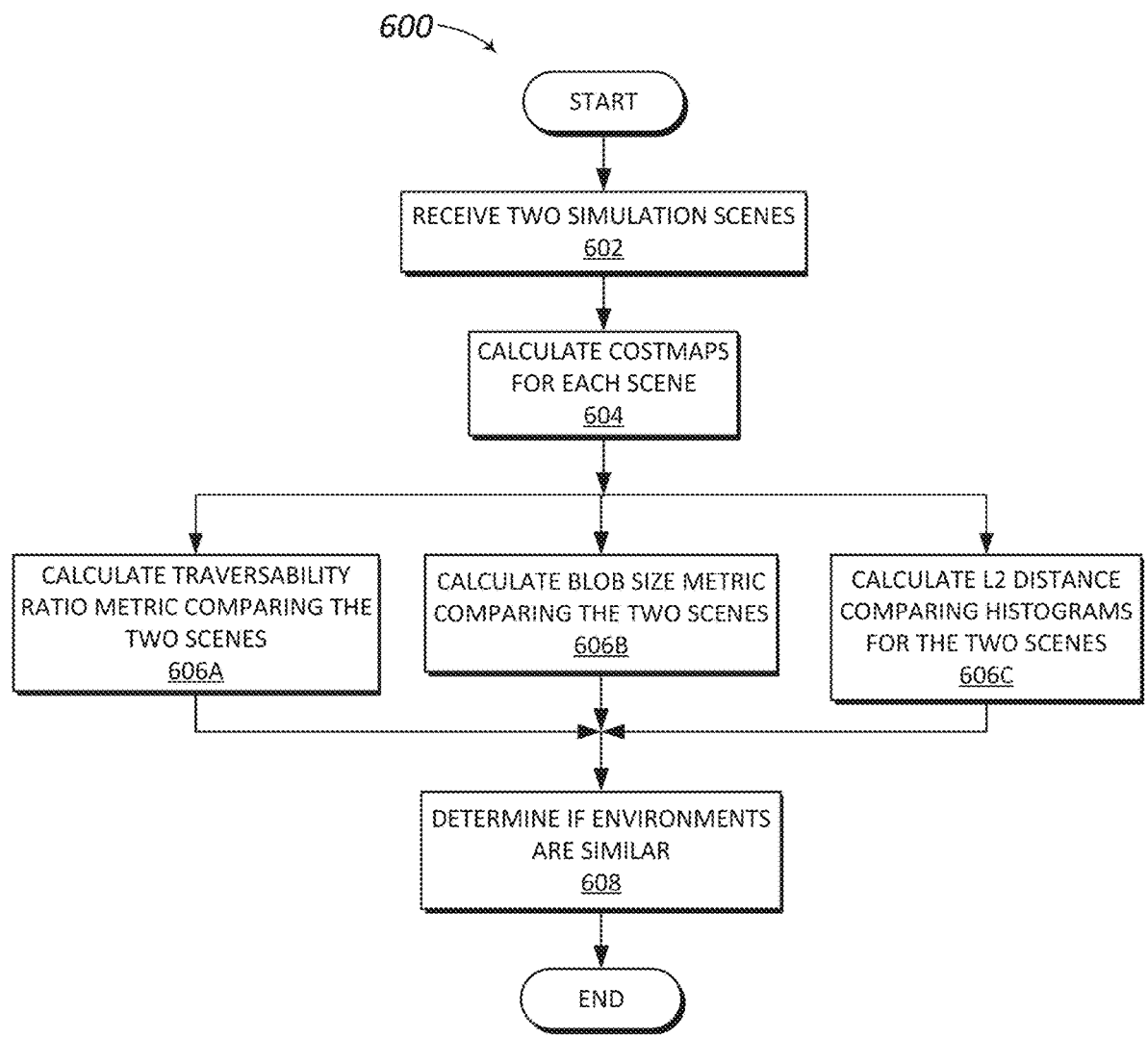
FIG. 6 is a flowchart diagram depicting operations for the environment comparison program, for comparing simulated environments for unmanned ground vehicle development and testing, on the distributed data processing environment of FIG. 1, consistent with the present disclosure.

FIG. 6 is a flowchart diagram depicting operations for the environment comparison program 112, for comparing simulated environments for unmanned ground vehicle development and testing, on the distributed data processing environment of FIG. 1, consistent with the present disclosure. In an alternative embodiment, the operations of workflow 600 may be performed by any other program while working with the environment comparison program 112.

It should be appreciated that embodiments of the present disclosure provide at least for comparing simulated environments for unmanned ground vehicle development and testing. However, FIG. 6 provides only an illustration of one implementation and does not imply any limitations with regard to the environments in which different embodiments may be implemented. Many modifications to the depicted environment may be made by those skilled in the art without departing from the scope of the disclosure as recited by the claims.

The environment comparison program 112 receives a simulation scene (operation 602). In the illustrated example embodiment, the environment comparison program 112 receives a simulation scene consisting of environmental features that may contain, but are not limited to, vegetation density and type (since trees, bushes, and tall grass each present unique challenges for off-road UGVs), negative obstacles, slope, blind turns, features such as drop-offs, ravines, other rugged features, etc.

The environment comparison program 112 calculates a costmap from the scene (operation 604). A costmap can be calculated from the scene in many different ways, but the important part is that it can be used for the UGV to make navigational decisions about how to travel through the environment. For example, a costmap related to terrain traversability can be calculated by taking the first- and second-order gradients of the terrain elevation and combining these values into a weighted average for each cell in the costmap. In this way, each cell represents the difficulty of traversing the terrain with respect to slope and changes in slope. Therefore, in this operation, the environment comparison program 112 calculates the costmap from the scene.

The environment comparison program 112 calculates a traversability ratio metric comparing the two scenes (operation 606A). The traversability ratio metric bins the costs of the costmaps, where each costmap is binned into the same number of bins, and calculates the average ratio between the corresponding bins from one scene, or environment, to another, as shown in Equation 1.

$$R_1 = \frac{B_{1_{environment2}}}{B_{1_{environment1}}} = \frac{B_1'}{B_1} \quad (1)$$

In Equation 1, $R_1$ is the ratio between the corresponding bins of the two environments, environment 1 and environment 2, where bin 1 ($B_1$) is the first bin in each environment. Note that the value of $B_1$ for environment 1 is noted as $B_1$, while the value of $B_1$ for environment 2 is noted as $B_1'$. Only the first bin is shown in Equation 1; in practice, any number of bins may be compared. If the ratio is close to 1, this indicates that the UGV perceives the two environments to be similar. In some embodiments, close to one means that if the ratio is between 0.5 and 1.5 (in other words, the percent change is within 50%) then the UGV perceives the environments to be similar and we can expect that the navigational performance will be similar as the UGV traverses the two environments under comparison.

The environment comparison program 112 calculates a blob size metric comparing the two scenes (operation 606B). The environment comparison program 112 calculates the blob size metric as described above in FIG. 4.

The environment comparison program 112 calculates an L2 distance comparing histograms for the two scenes (operation 606C). The environment comparison program 112 calculates the L2 distance (also known as the Euclidean distance) between histograms by binning the accumulated costs of the costmaps, and creating histograms for each scene, or environment, from the binned costs of each costmap. The histograms from the two environments are compared to each other using the L2 distance. The distance is calculated as in Equation 2.

$$d(B,B')=\sqrt{\Sigma_{i=1}^{n}(B_i'-B_i)^2} \quad (2)$$

If the distance is small, this indicates that the UGV perceives the two environments to be similar. In some embodiments, if the L2 distance (measured in costmap cells, which may be measured in image pixels) is equal to or less than 30% of the total number of cells in the costmap, then the UGV perceives the two environments to be similar.

The environment comparison program 112 determines if the environments are similar (operation 608). The environment comparison program 112 determines if the environments are similar based on the calculated metrics of operations 606A, 606B, and 606C. In some embodiments, the environments are considered similar if the traversability and blob size metrics are within the range of 20% to 40%. This range is a balance between the environments being different enough but not too different. In this context, "different enough" is construed to mean different enough to exercise aspects of the UGV system that are not exercised by the original environment. This is useful to make sure that the set of simulation scenes being used for UGV system testing is representative of a given target environment (e.g., a pine forest in the southeastern United States), but the set of scenes contains enough variety to give confidence to the tester that the system will be proven out across a wide range of the possible test space. Likewise, "too different" is construed to mean that the UGV perceives the environment to be of a completely different type than the original (for example, a desert as opposed to a forested environment; or a flat grassy plain as opposed to an area with rolling hills and scrubby bushes).

The environment comparison program 112 then ends for this cycle.

Figure 7:
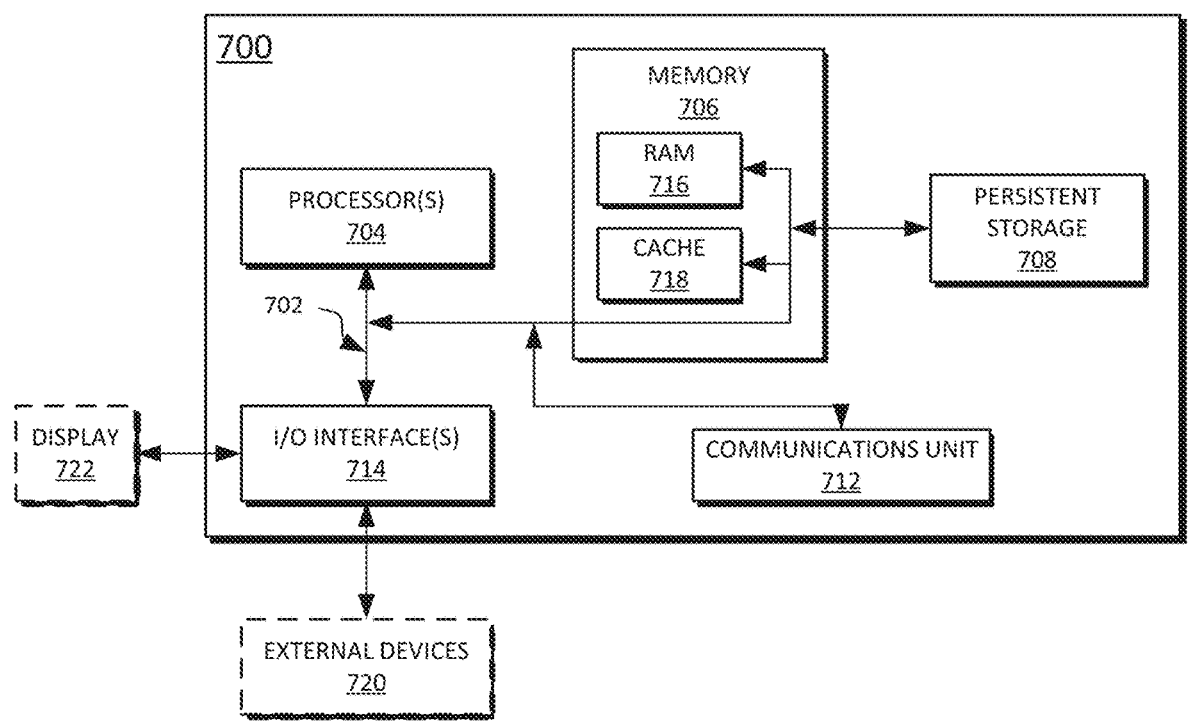
FIG. 7 depicts a block diagram of components of the computing device executing the environment comparison program within the distributed data processing environment of FIG. 1, consistent with the present disclosure.

FIG. 7 is a block diagram depicting components of one example of the computing device 110 suitable for environment comparison program 112, in accordance with at least one embodiment of the disclosure. FIG. 7 displays the computing device or computer 700, one or more processor(s) 704 (including one or more computer processors), a communications fabric 702, a memory 706 including, a random-access memory (RAM) 716 and a cache 718, a persistent storage 708, a communications unit 712, I/O interfaces 714, a display 722, and external devices 720. It should be appreciated that FIG. 7 provides only an illustration of one embodiment and does not imply any limitations with regard to the environments in which different embodiments may be implemented. Many modifications to the depicted environment may be made.

As depicted, the computer 700 operates over the communications fabric 702, which provides communications between the computer processor(s) 704, memory 706, persistent storage 708, communications unit 712, and input/output (I/O) interface(s) 714. The communications fabric 702 may be implemented with an architecture suitable for passing data or control information between the processors 704 (e.g., microprocessors, communications processors, and network processors), the memory 706, the external devices 720, and any other hardware components within a system. For example, the communications fabric 702 may be implemented with one or more buses.

The memory 706 and persistent storage 708 are computer readable storage media. In the depicted embodiment, the memory 706 comprises a RAM 716 and a cache 718. In general, the memory 706 can include any suitable volatile or non-volatile computer readable storage media. Cache 718 is a fast memory that enhances the performance of processor(s) 704 by holding recently accessed data, and near recently accessed data, from RAM 716.

Program instructions for environment comparison program 112 may be stored in the persistent storage 708, or more generally, any computer readable storage media, for execution by one or more of the respective computer processors 704 via one or more memories of the memory 706. The persistent storage 708 may be a magnetic hard disk drive, a solid-state disk drive, a semiconductor storage device, flash memory, read only memory (ROM), electronically erasable programmable read-only memory (EEPROM), or any other computer readable storage media that is capable of storing program instruction or digital information.

The media used by persistent storage 708 may also be removable. For example, a removable hard drive may be used for persistent storage 708. Other examples include optical and magnetic disks, thumb drives, and smart cards that are inserted into a drive for transfer onto another computer readable storage medium that is also part of persistent storage 708.

The communications unit 712, in these examples, provides for communications with other data processing systems or devices. In these examples, the communications unit 712 includes one or more network interface cards. The communications unit 712 may provide communications through the use of either or both physical and wireless communications links. In the context of some embodiments of the present disclosure, the source of the various input data may be physically remote to the computer 700 such that the input data may be received, and the output similarly transmitted via the communications unit 712.

The I/O interface(s) 714 allows for input and output of data with other devices that may be connected to computer 700. For example, the I/O interface(s) 714 may provide a connection to external device(s) 720 such as a keyboard, a keypad, a touch screen, a microphone, a digital camera, and/or some other suitable input device. External device(s) 720 can also include portable computer readable storage media such as, for example, thumb drives, portable optical or magnetic disks, and memory cards. Software and data used to practice embodiments of the present disclosure, e.g., environment comparison program 112, can be stored on such portable computer readable storage media and can be loaded onto persistent storage 708 via the I/O interface(s) 714. I/O interface(s) 714 also connect to a display 722.

Display 722 provides a mechanism to display data to a user and may be, for example, a computer monitor. Display 722 can also function as a touchscreen, such as a display of a tablet computer.

According to one aspect of the disclosure there is thus provided a system for comparing simulated environments for unmanned ground vehicles, the system including: one or more computer processors; one or more computer readable storage media; and program instructions stored on the one or more computer readable storage media for execution by at least one of the one or more computer processors. The stored program instructions are configured to: receive a first simulation scene and a second simulation scene; calculate a first costmap for the first simulation scene and a second costmap for the second simulation scene; calculate a traversability ratio metric comparing the first costmap and the second costmap; calculate a blob size metric comparing the first costmap and the second costmap; calculate an L2 distance between a first plurality of histograms from the first costmap and a second plurality of histograms from the second costmap; and determine whether a first environment of the first simulation scene and a second environment of the second simulation scene are similar based on the traversability ratio metric, the blob size metric, and the L2 distance.

According to another aspect of the disclosure there is thus provided a computer-implemented method for comparing simulated environments for unmanned ground vehicles, the computer-implemented method comprising: receiving, by one or more computer processors, a first simulation scene and a second simulation scene; calculating, by the one or more computer processors, a first costmap for the first simulation scene and a second costmap for the second simulation scene; calculating, by the one or more computer processors, a traversability ratio metric comparing the first costmap and the second costmap; calculating, by the one or more computer processors, a blob size metric comparing the first costmap and the second costmap; calculating, by the one or more computer processors, an L2 distance between a first plurality of histograms from the first costmap and a second plurality of histograms from the second costmap; and determining, by the one or more computer processors, whether a first environment of the first simulation scene and a second environment of the second simulation scene are similar based on the traversability ratio metric, the blob size metric, and the L2 distance.

According to yet another aspect of the disclosure there is thus provided a system for comparing simulated environments for unmanned ground vehicles, the system including: one or more computer processors; one or more computer readable storage media; and program instructions stored on the one or more computer readable storage media for execution by at least one of the one or more computer processors, the stored program instructions. The stored program instructions are configured to: receive a first simulation scene and a second simulation scene; calculate a first costmap for the first simulation scene and a second costmap for the second simulation scene; calculate a traversability ratio metric from the first costmap and the second costmap; calculate a blob size metric from the first costmap and the second costmap; calculate an L2 distance between a first plurality of histograms from the first costmap and a second plurality of histograms from the second costmap; and determine whether a first environment of the first simulation scene and a second environment of the second simulation scene are similar, wherein the first simulation scene and the second simulation scene are similar if the traversability ratio metric of a first set of bins of the first simulation scene and a second set of bins of the second simulation scene is between 0.5 and 1.5, the blob size metric between a first average size of the first simulation scene and a second average size of the second simulation scene is less than or equal to 25%, and the L2 distance between a first histogram of the first simulation scene and a second histogram of the second simulation scene is less than or equal to 30%.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

"Circuitry," as used in any embodiment herein, may comprise, for example, singly or in any combination, hard-wired circuitry, programmable circuitry such as processors comprising one or more individual instruction processing cores, state machine circuitry, and/or firmware that stores instructions executed by programmable circuitry and/or future computing circuitry including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an integrated circuit (IC), system on-chip (SoC), application-specific integrated circuit (ASIC), programmable logic devices (PLD), digital signal processors (DSP), field programmable gate array (FPGA), logic gates, registers, semiconductor device, chips, microchips, chip sets, etc.

The programs described herein are identified based upon the application for which they are implemented in a specific embodiment of the disclosure. However, it should be appreciated that any particular program nomenclature herein is used merely for convenience, and thus the disclosure should not be limited to use solely in any specific application identified and/or implied by such nomenclature.

The present disclosure may be a system, a method, and/or a computer program product. The system or computer program product may include one or more non-transitory computer readable storage media having computer readable program instructions thereon for causing a processor to carry out aspects of the present disclosure.

The one or more non-transitory computer readable storage media can be any tangible device that can retain and store instructions for use by an instruction execution device. The one or more non-transitory computer readable storage media may be, for example, but is not limited to, an electronic storage device, a magnetic storage device, an optical storage device, an electromagnetic storage device, a semiconductor storage device, or any suitable combination of the foregoing. A non-exhaustive list of more specific examples of the one or more non-transitory computer readable storage media includes the following: a portable computer diskette, a hard disk, a RAM, a ROM, an EPROM or Flash memory, a Static Random Access Memory (SRAM), a portable Compact Disc Read-Only Memory (CD-ROM), a Digital Versatile Disk (DVD), a memory stick, a floppy disk, a mechanically encoded device such as punch-cards or raised structures in a groove having instructions recorded thereon, and any suitable combination of the foregoing. A non-transitory computer readable storage media, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from one or more non-transitory computer readable storage media or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in one or more non-transitory computer readable storage media within the respective computing/processing device.

Computer readable program instructions for carrying out operations of the present disclosure may be assembler instructions, Instruction-Set-Architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some embodiments, electronic circuitry including, for example, programmable logic circuitry, Field-Programmable Gate Arrays (FPGA), or other Programmable Logic Devices (PLD) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in one or more non-transitory computer readable storage media that can direct a computer, a programmable data processing apparatus, and/or other devices to function in a particular manner, such that the one or more non-transitory computer readable storage media having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operations to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, a segment, or a portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the disclosure. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A system for comparing simulated environments for an unmanned ground vehicle (UGV), the system comprising:
    one or more computer processors;
    one or more computer readable storage media; and
    program instructions stored on the one or more computer readable storage media for execution by at least one of the one or more computer processors, the stored program instructions including instructions to:
    receive a first simulation scene and a second simulation scene;
    calculate a first costmap for the first simulation scene and a second costmap for the second simulation scene;
    calculate a traversability ratio metric by comparing the first costmap and the second costmap;
    calculate a blob size metric comparing the first costmap and the second costmap;
    calculate an L2 distance between a first plurality of histograms from the first costmap and a second plurality of histograms from the second costmap; and
    determine whether a first environment of the first simulation scene and a second environment of the second simulation scene are within 20% to 40% of the traversability ratio metric, the blob size metric, and the L2 distance; wherein the traversability ratio metric being used by the UGV to determine a navigational path.

2. The system of claim 1, wherein calculate the traversability ratio metric by comparing the first costmap and the second costmap further comprises one or more of the following program instructions, stored on the one or more computer readable storage media, to:
    divide the first costmap for the first simulation scene into a first set of bins and the second costmap for the second simulation scene into a second set of bins, wherein the first set of bins and the second set of bins each contain a same number of bins;
    determine a ratio between each bin of first set of bins and a corresponding bin of the second set of bins;
    determine an average ratio by averaging the ratio between each bin of the first set of bins and the corresponding bin of the second set of bins; and
    determine whether the first simulation scene and the second simulation scene are similar, wherein the first simulation scene and the second simulation scene are similar if the average ratio of the first set of bins and the second set of bins is between 0.5 and 1.5.

3. The system of claim 2, wherein each bin contains at least one pixel.

4. The system of claim 1, wherein calculate the blob size metric comparing the first costmap and the second costmap further comprises one or more of the following program instructions, stored on the one or more computer readable storage media, to:
    divide the first costmap for the first simulation scene into a first set of bins and the second costmap for the second simulation scene into a second set of bins, wherein the first set of bins and the second set of bins each contain a same number of bins;
    perform a first thresholding operation for each bin of the first set of bins and each bin the second set of bins to generate a new costmap image for each bin;
    perform a second thresholding operation for each bin of the first set of bins and each bin the second set of bins to generate a first binary image for the first set of bins and a second binary image for the second set of bins;
    perform connected component labeling on the first binary image and the second binary image, wherein the connected component labeling identifies a first connected component and a first connected component size for each bin of the first binary image and a second connected component and a second connected component size for each bin of the second binary image;
    calculate a first average size for the first connected component size and a second average size for the second connected component size; and
    determine whether the first simulation scene and the second simulation scene are similar, wherein the first simulation scene and the second simulation scene are similar if a size difference between the first average size and the second average size is less than or equal to 25%.

5. The system of claim 4, wherein the connected component labeling uses a connectedComponentsWithStats function.

6. The system of claim 5, wherein the connectedComponentsWithStats function uses a Spaghetti algorithm with 8-way connectivity.

7. The system of claim 1, wherein calculate the L2 distance between the first plurality of histograms from the first costmap and the second plurality of histograms from the second costmap further comprises one or more of the following program instructions, stored on the one or more computer readable storage media, to:
divide the first costmap for the first simulation scene into a first set of bins based on a first cost and the second costmap for the second simulation scene into a second set of bins based on a second cost, wherein the first set of bins and the second set of bins each contain a same number of bins;
create a first histogram for the first set of bins and a second histogram for the second set of bins;
calculate a Euclidean distance between the first histogram and the second histogram; and
determine whether the first simulation scene and the second simulation scene are similar, wherein the first simulation scene and the second simulation scene are similar if the Euclidean distance between the first histogram and the second histogram is less than or equal to 30%.

8. The system of claim 7, wherein the Euclidean distance is measured in costmap cells.

9. The system of claim 7, wherein the Euclidean distance is measured in image pixels.

10. A computer-implemented method for comparing simulated environments for an unmanned ground vehicle (UGV), the computer-implemented method comprising:
receiving, by one or more computer processors, a first simulation scene and a second simulation scene;
calculating, by the one or more computer processors, a first costmap for the first simulation scene and a second costmap for the second simulation scene;
calculating, by the one or more computer processors, a traversability ratio metric from the first costmap and the second costmap;
calculating, by the one or more computer processors, a blob size metric from the first costmap and the second costmap;
calculating, by the one or more computer processors, an L2 distance between a first plurality of histograms from the first costmap and a second plurality of histograms from the second costmap; and
determining, by the one or more computer processors, whether a first environment of the first simulation scene and a second environment of the second simulation scene are within 20% to 40% of the traversability ratio metric, the blob size metric, and the L2 distance; wherein the traversability ratio metric being used by the UGV to determine a navigational path.

11. The computer-implemented method of claim 10, wherein calculating the traversability ratio metric from the first costmap and the second costmap further comprises:
dividing, by the one or more computer processors, the first costmap for the first simulation scene into a first set of bins and the second costmap for the second simulation scene into a second set of bins, wherein the first set of bins and the second set of bins each contain a same number of bins;
determining, by the one or more computer processors, a ratio between each bin of first set of bins and a corresponding bin of the second set of bins;
determining, by the one or more computer processors, an average ratio by averaging the ratio between each bin of the first set of bins and the corresponding bin of the second set of bins; and
determining, by the one or more computer processors, whether the first simulation scene and the second simulation scene are similar, wherein the first simulation scene and the second simulation scene are similar if the average ratio of the first set of bins and the second set of bins is between 0.5 and 1.5.

12. The computer-implemented method of claim 11, wherein each bin contains at least one pixel.

13. The computer-implemented method of claim 10, wherein calculating the blob size metric from the first costmap and the second costmap further comprises:
dividing, by the one or more computer processors, the first costmap for the first simulation scene into a first set of bins and the second costmap for the second simulation scene into a second set of bins, wherein the first set of bins and the second set of bins each contain a same number of bins;
performing, by the one or more computer processors, a first thresholding operation for each bin of the first set of bins and each bin the second set of bins to generate a new costmap image for each bin;
performing, by the one or more computer processors, a second thresholding operation for each bin of the first set of bins and each bin the second set of bins to generate a first binary image for the first set of bins and a second binary image for the second set of bins;
performing, by the one or more computer processors, connected component labeling on the first binary image and the second binary image, wherein the connected component labeling identifies a first connected component and a first connected component size for each bin of the first binary image and a second connected component and a second connected component size for each bin of the second binary image;
calculating, by the one or more computer processors, a first average size for the first connected component size and a second average size for the second connected component size; and
determining, by the one or more computer processors, whether the first simulation scene and the second simulation scene are similar, wherein the first simulation scene and the second simulation scene are similar if a size difference between the first average size and the second average size is less than or equal to 25%.

14. The computer-implemented method of claim 13, wherein the connected component labeling uses a connectedComponentsWithStats function.

15. The computer-implemented method of claim 14, wherein the connectedComponentsWithStats function uses a Spaghetti algorithm with 8-way connectivity.

16. The computer-implemented method of claim 10, wherein calculating the L2 distance between the first plurality of histograms from the first costmap and the second plurality of histograms from the second costmap further comprises:
dividing, by the one or more computer processors, the first costmap for the first simulation scene into a first set of bins and the second costmap for the second simulation scene into a second set of bins, wherein the first set of bins and the second set of bins each contain a same number of bins;

creating, by the one or more computer processors, a first histogram for the first set of bins and a second histogram for the second set of bins;

calculating, by the one or more computer processors, a Euclidean distance between the first histogram and the second histogram; and determining, by the one or more computer processors, whether the first simulation scene and the second simulation scene are similar, wherein the first simulation scene and the second simulation scene are similar if the Euclidean distance between the first histogram and the second histogram is less than or equal to 30%.

17. The computer-implemented method of claim 16, wherein the Euclidean distance is measured in costmap cells.

18. The computer-implemented method of claim 16, wherein the Euclidean distance is measured in image pixels.

19. A system for comparing simulated environments for an unmanned ground vehicle (UGV), the system comprising:

one or more computer processors;

one or more computer readable storage media; and program instructions stored on the one or more computer readable storage media for execution by at least one of the one or more computer processors, the stored program instructions including instructions to:

receive a first simulation scene and a second simulation scene;

calculate a first costmap for the first simulation scene and a second costmap for the second simulation scene;

calculate a traversability ratio metric from the first costmap and the second costmap;

calculate a blob size metric from the first costmap and the second costmap;

calculate an L2 distance between a first plurality of histograms from the first costmap and a second plurality of histograms from the second costmap; and determine whether a first environment of the first simulation scene and a second environment of the second simulation scene are similar, wherein the first simulation scene and the second simulation scene are similar if the traversability ratio metric of a first set of bins of the first simulation scene and a second set of bins of the second simulation scene is between 0.5 and 1.5, the blob size metric between a first average size of the first simulation scene and a second average size of the second simulation scene is less than or equal to 25%, and the L2 distance between a first histogram of the first simulation scene and a second histogram of the second simulation scene is less than or equal to 30%; wherein the traversability ratio metric being used by the UGV to determine a navigational path.

20. The system of claim 19, wherein the first simulation scene and the second simulation scene each consist of thousands to millions of pixels.

\* \* \* \* \*